United States Patent [19]

Mori et al.

[11] Patent Number: 4,878,610

[45] Date of Patent: Nov. 7, 1989

[54] DIE BONDING APPARATUS

[75] Inventors: Ryuichiro Mori; Syuichi Osaka; Toshinobu Banjo, all of Itami, Japan

[73] Assignee: Mitsubishi Denki Kabushiki Kaisha, Japan

[21] Appl. No.: 307,512

[22] Filed: Feb. 8, 1989

[30] Foreign Application Priority Data

Aug. 12, 1988 [JP] Japan .................................. 63-199994

[51] Int. Cl.$^4$ ............................................. B23K 37/04
[52] U.S. Cl. ........................................ 228/6.2; 228/13; 228/47
[58] Field of Search .................... 228/123, 5.1, 6.2, 13, 228/47; 269/903; 221/77, 103; 29/834

[56] References Cited

U.S. PATENT DOCUMENTS

| 4,151,945 | 5/1979 | Ragard et al. ......................... 228/6.2 |
| 4,393,579 | 7/1983 | Van Hooreweder .................. 29/834 |
| 4,602,417 | 7/1986 | Mesch et al. ........................... 228/47 |
| 4,644,642 | 2/1987 | Wardenaar et al. .................. 228/6.2 |
| 4,731,923 | 3/1988 | Yagi et al. .............................. 29/834 |
| 4,763,827 | 8/1988 | Watanabe et al. ..................... 228/47 |

OTHER PUBLICATIONS

"Die bonder", Denshi Zairyo (Electronic Material), 1985, pp. 131-137.

Primary Examiner—Nicholas P. Godici
Assistant Examiner—Samuel M. Heinrich
Attorney, Agent, or Firm—Leydig, Voit & Mayer

[57] ABSTRACT

A die bonding apparatus includes a stocker for temporarily accommodating dice, a first conveying device for successively picking up a plurality of dice from one wafer and conveying them to the stocker, a wafer loader/unloader for replacing the wafer from which the dice have been picked up with a new one, a bonding station for bonding a die to a work which serves as a die mounting medium, a work loader for supplying works to the bonding station, and a second conveying device for successively conveying the dice accommodated in the stocker to the bonding station.

9 Claims, 5 Drawing Sheets

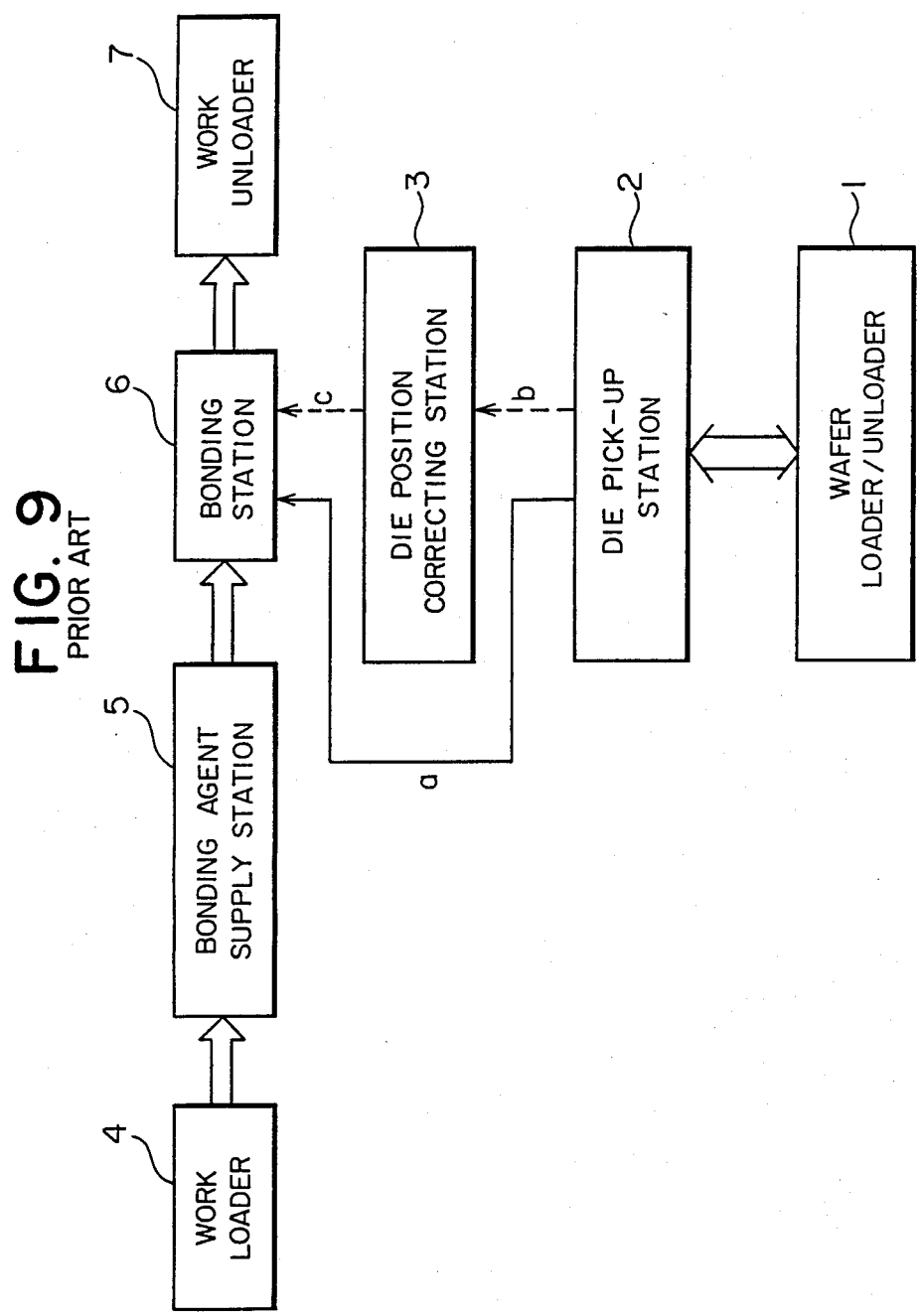

DIE BONDING APPARATUS

BACKGROUND OF THE INVENTION

1. Field of the Invention

The present invention relates to a die bonding apparatus and, more particularly, to a die bonding apparatus for bonding a large number of separate semiconductor chips (hereinafter referred to as dice) of a semiconductor wafer to works such as lead frames.

2. Description of the Related Art

A conventional die bonding apparatus of the above-described type will be described below with reference to FIG. 9. A die pick-up station 2 for picking up a separate die of a wafer is connected to a wafer loader/unloader 1 which accommodates a plurality of semiconductor wafers (not shown). A die position correcting station 3 for correcting the position of a die is connected to the die pick-up station 2. A bonding agent supply station 5 for supplying to a work a bonding agent such as a solder or a resin adhesive is connected to a work loader 4 which accommodates a plurality of works (not shown) such as lead frames or ceramic substrates which serve as die mounting media. A die bonding station 6 for bonding a die to a work is coupled to the bonding agent supply station 5. The die pick-up station 2 is connected to the die bonding station 6 directly or via the die position correcting station 3 so as to supply a die to the bonding station 6 from the die pick-up station 2, and a work unloader 7 for accommodating works with the die bonded thereto is connected to the bonding station 6.

In the above-described die bonding apparatus, die bonding is conducted in the manner described below.

First, one semiconductor wafer is fed from the wafer loader/unloader 1 to the die pick-up station 2. The wafer has a large number of dice separated from each other and has been subjected to a wafer test or a die sorting test in which a bad mark is appended to a defective die. In the die pick-up station 2, one good die which has no bad mark appended thereto is picked up from the wafer which has been supplied from the wafer loader/unloader 1, and is supplied to the bonding station 6 directly via a route a shown in FIG. 9. Alternatively, the die which has been picked up in the die pick-up station 2 is fed via a route b to the die position correcting station 3, where the angular position of the die is corrected, and it is then supplied to the bonding station 6 via a route c.

On the other hand, in the bonding agent supply station 5, a bonding agent is supplied to a work which has been fed from the work loader 4 at a predetermined position, and this work is then fed to the bonding station 6.

In the bonding station 6, the die which has been fed from the die pick-up station 2 directly or via the die position correcting station 3 is bonded to the work which has been conveyed from the bonding agent supply station 5.

After the bonding of one die has been completed, a next good die is supplied from the die pick-up station 2 to the bonding station 6 so as to be bonded to another work. The works with the dice bonded thereto are accommodated in the work unloader 7.

Bonding is performed on successive dice in the manner described above until all the good dice have been picked up from the semiconductor wafer which has been supplied from the wafer loader/unloader 1 to the die pick-up station 2. When all the good dice have been picked up, the wafer loader/unloader 1 retrieves this wafer from the die pick-up station 2, and supplies a new wafer to the die pick-up station 2. The die bonding operation begins again using this new wafer.

However, in the conventional apparatus, no die can be supplied to the die bonding station 6 while the wafer loader/unloader 1 is replacing a semiconductor wafer, and the bonding operation therefore has to be interrupted during this time, resulting in a reduction of the bonding capacity per unit time.

In particular, when a wafer of the type with a low yield due to an increase in the dimensions of a die or higher integration having a reduced number of good dice per wafer, bonding capacity per unit time becomes greatly reduced, as shown by the solid line in FIG. 10, since the ratio of the wafer replacing time to the overall operating time of the die bonding apparatus is high.

SUMMARY OF THE INVENTION

In view of the above-described problems of the conventional die bonding apparatus, an object of the present invention is to provide a die bonding apparatus which enables bonding capacity per unit time to be improved.

To this end, the present invention provides a die bonding apparatus which comprises: a stocker for temporarily accommodating dice; a first conveying means for picking up a plurality of dice from one wafer and conveying them to the stocker in succession; a wafer loader/unloader for replacing the wafer from which the dice have been taken out for a new wafer; a bonding station for bonding a die to a work which serves as a die mounting medium; a work loader for supplying the works to the bonding station; and a second conveying means for successively conveying the dice accommodated in the stocker to the bonding station.

BRIEF DESCRIPTION OF THE DRAWINGS

FIG. 9 is a block diagram of a conventional die bonding apparatus; and

DESCRIPTION OF THE PREFERRED EMBODIMENTS

A few embodiments of the present invention will be described below with reference to the accompanying drawings.

Figure 1:
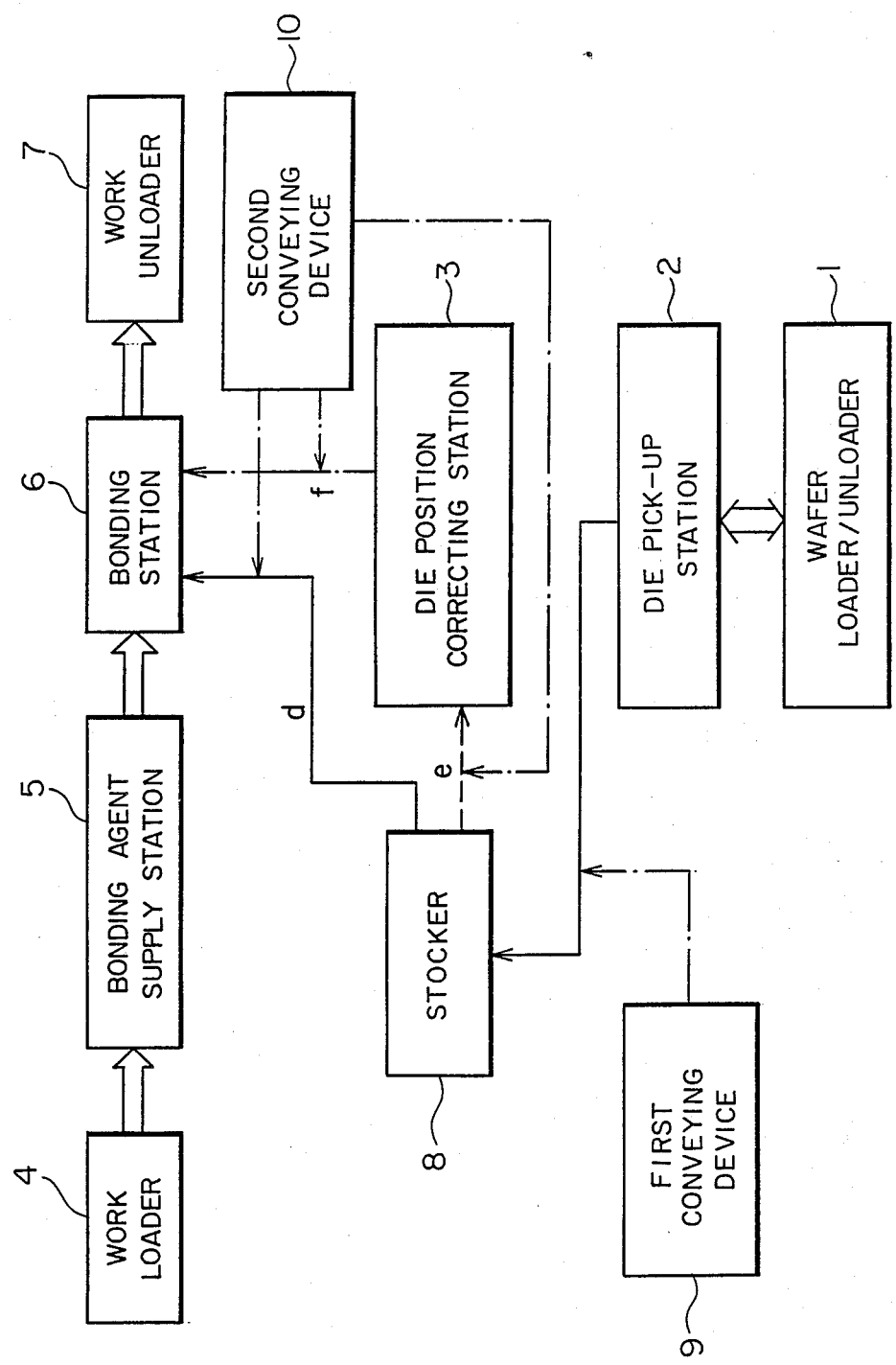
FIG. 1 is a block diagram of a die bonding apparatus showing an embodiment of the present invention.

Referring first to FIG. 1, a die pick-up station 2 is coupled to a wafer loader/unloader 1 which accommodates a plurality of semiconductor wafers (not shown), and a stocker 8 for temporarily accommodating dice is disposed in the vicinity of the die pick-up station 2. In the vicinity of the die pick-up station 2 and the stocker 8 is disposed a first conveying device 9 for picking up dice from a wafer disposed on the die pick-up station 2 and accommodating them in the stocker 8 in succession. A die position correcting station 3 for correcting the position of a die is coupled to the stocker 8.

A bonding agent supply station 5 for supplying a bonding agent such as a solder or a resin adhesive to a work is connected to a work loader 4 which accommodates a plurality of works. The works are die mounting media and may be lead frames or ceramic substrates. A die bonding station 6 where a die is bonded to a work is coupled to the bonding agent supply station 5.

In the vicinity of the bonding station 6 is disposed a second conveying device 10 for supplying dice from the stocker 8 directly or via the die position correcting station 3 to the bonding station 6 one at a time. A work unloader 8 for accommodating works with a die bonded thereto is coupled to the bonding station 6.

Figure 2:
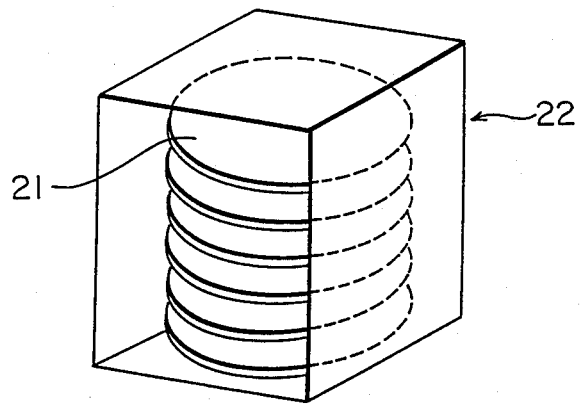
FIG. 2 is a perspective view showing a magazine 22 incorporated in a wafer loader/unloader 1 of the die bonding apparatus of FIG. 1.
Figures 3, 4:
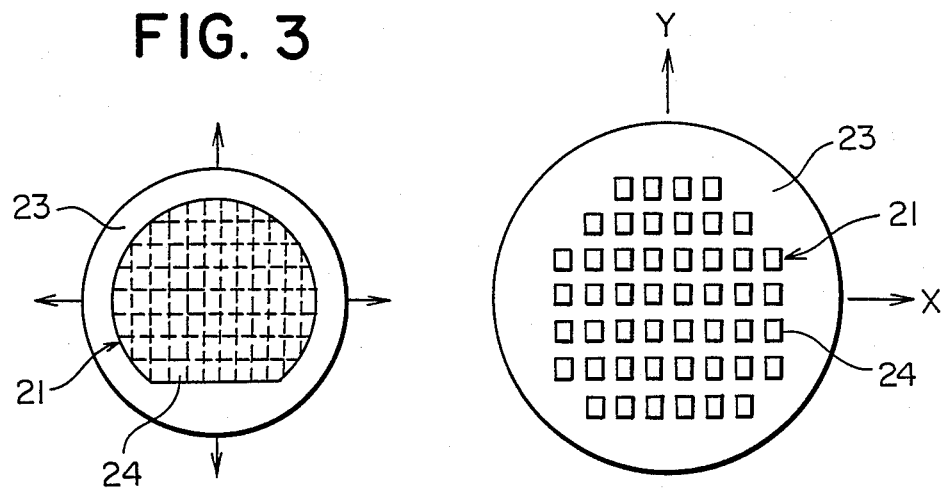
FIGS. 3 and 4 are plan views showing a wafer 21, respectively.

The wafer loader/unloader 1 has a magazine 22 for accommodating a plurality of wafers 21, as shown in FIG. 2. Each of the wafers 21 in the magazine 22 is in the state shown in FIG. 4 in which a plurality of separate dice 24 are spaced away from each other. To prepare this state, the wafer is affixed to a thin sheet 23 made of a resin, as shown in FIG. 3, and is then separated into a plurality of dice 24 shown by the broken line in FIG. 3. Thereafter, the dice 24 are spaced away from each other, as shown in FIG. 4, by the stretching of the sheet 3 in all directions to plastically deform the sheet 23. The wafers 21 accommodated in the magazine 22 have been subjected to a wafer test or a die sorting test in which a bad mark (not shown) is appended to the surfaces of the defective dice 24 in the wafer 21.

Figure 5:
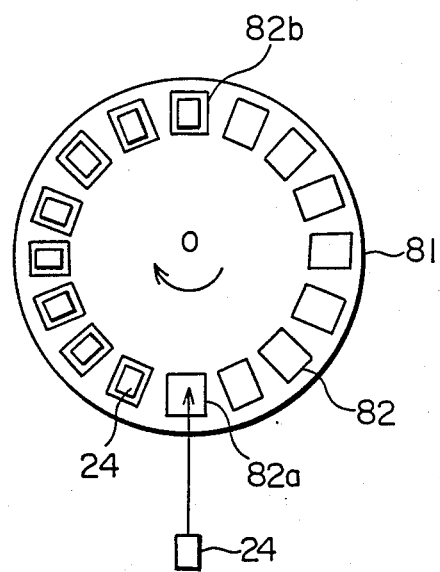
FIG. 5 is a plan view showing a stocker 8 of the apparatus of FIG. 1.

The stocker 8 has a horizontal disk-shaped stage 81 with a plurality of die retaining portions 82 formed around the periphery thereof, as shown in FIG. 5. The stage 81 is rotatable around the center O, and each of the die retaining portions 82 comprises a recess formed on the surface of the stage 81. A die 24 which is conveyed by the first conveying device 9 from the die pick-up station 2 is placed at a die retaining portion 82a located at a first predetermined position. After the die 24 has been placed at that die retaining portion 82a, the stage 81 is rotated by a driving means (not shown) connected thereto until a die retaining portion 82 adjacent to the die retaining portion 82a comes to the first predetermined position. The driving means may be a stepping motor.

Figure 6:
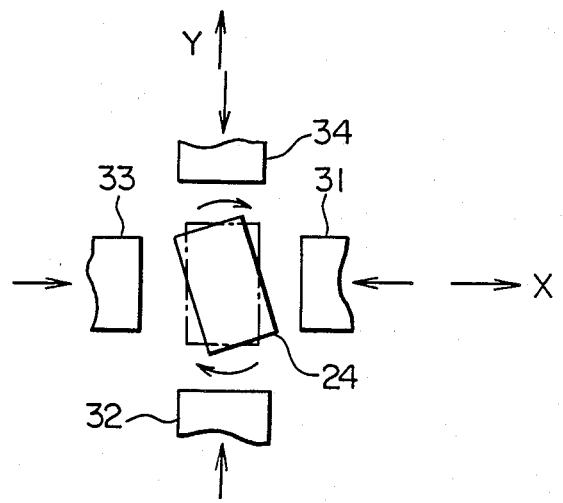
FIG. 6 is a plan view showing a die position correcting station 3 of the apparatus of FIG. 1.

The die position correcting station 3 is adapted to correct the direction and angle of a die 24 which has been taken out of the stocker 8 by the second conveying device 10. When the sheet 23 shown in FIG. 3 is stretched in all directions, the dice 24 pasted on the sheet 23 shift from the directions indicated by X and Y in FIG. 4. As shown in FIG. 6, the position correcting station 3 has four correcting jigs 31 to 34 which are directed in the directions indicated by X and Y. A die 24 which has been shifted is placed at the center of the jigs, and the position or angle of the die 24 is corrected by pressing of the jigs 31 to 34 against the die 24.

Each of the first and second conveying devices 9 and 10 has a movable arm (not shown) and a pick-up portion provided at the forward end of the movable arm for retaining a die 24. The pick-up portion may be constructed to mechanically retain the die 24 or to retain it by vacuum.

Next, the operation of this embodiment will be described below.

First, one semiconductor wafer 21, which comprises a plurality of dice 24 pasted on the sheet 23 as shown in FIG. 4, is fed from the magazine 22 in the wafer loader/unloader 1 to the die pick-up station 2. In addition, as stated above, a die sorting test has been conducted on the wafer 21, and the defective dice 24 are provided with a bad mark. In the die pick-up station 2, a good die 24 which has no bad mark is picked up from among the dice constituting the wafer 21 supplied from the wafer loader/unloader 1, and is accommodated temporarily in the stocker 8 by the first conveying device 9. This operation is repeated so that the dice 24 are accommodated in the stocker 8 successively.

In the stocker 8, a die 24 which has been fed from the die pick-up station 2 is placed at a die retaining portion 82a located at the first predetermined position shown in FIG. 5. Thereafter, the dice 24 are successively placed at the plurality of individual die retaining portions 82 while the stage 81 is being rotated. The second conveying device 10 picks up a die 24 from the die retaining portion located at a second predetermined position which is for example indicated by a reference numeral 82b in FIG. 5, and supplies it to the bonding station 6 directly via a route $d$. Alternatively, the die 24 is first supplied by the second conveying device 10 to the die position correcting station 3 where the angular position of the die 24 is corrected via a route $e$, and is then fed to the bonding station 6 via a route $f$.

On the other hand, in the bonding agent supply station 5, a bonding agent is supplied to the predetermined position of an unillustrated work which has been conveyed from the work loader 4, and the work with the bonding agent attached thereto is fed to the bonding station 6. In the bonding station 6, the die 24 which has been fed from the stocker 8 directly or via the die position correcting station 3 is bonded to the work which has been fed from the bonding agent supply station 5.

The cycle time of the die conveying operation from the stocker 8 to the bonding station 6 conducted by the second conveying device 10 is set to a value equivalent to the cycle time of the die bonding conducted in the bonding station 6. In consequence, the second conveying device 10 takes a subsequent die 24 from the stocker 8 while die bonding is being performed on the previous die 24 in the bonding station 6, and supplies the subsequent die 24 to the bonding station 6 as soon as die bonding on the previous die 24 has been completed.

Die bonding is thus performed on the successive dice 24 in the bonding station 6, while the work with a die bonded thereto is accommodated in the work unloader 7.

The cycle time of the die conveying operation from the die pick-up station 2 to the stocker 8 by the first conveying device 9 is set to a value which is shorter than the cycle time of the die conveying operation from the stocker 8 to the bonding station 6 conducted by the second conveying device 10, i.e., the cycle time of the die bonding conducted in the bonding station 6. As a result, the number of dice 24 accommodated in the stocker 8 gradually increases.

The above-described die bonding operation continues until all of the good dice 24 of the wafer 21 supplied from the wafer loader/unloader 1 to the die pick-up station 2 have been picked up. At this time, the wafer loader/unloader 1 retrieves this wafer 21 from the die pick-up station 2, and supplies a new wafer 21 thereto.

During this replacing operation, the die pick-up operation and the accommodation thereof in the stocker 8 which are conducted by the first conveying device 9 is interrupted. However, since the stocker 8 already contains a plurality of dice 24 by this time, the second conveying device 10 can continue to convey the dice 24 from the stocker 8 to the bonding station 6 during this replacement. In other words, the die bonding operation continues in the bonding station 6 regardless of the replacement of the wafers 21 which is performed by the wafer loader/unloader 1.

In order to achieve this uninterrupted bonding operation, it is required that the stocker 8 contain more than the number of dice 24 which the bonding station 6 processes while the wafer 21 is being replaced. For example, if the rate at which the wafer loader/unloader 1 replaces the wafer 21 is 30 seconds/wafer and the cycle time of the bonding operation in the bonding station 6 is 3 seconds/die, 10 (equal to 30 seconds/3 seconds) or more dice should be accommodated in the stocker 8.

Figure 10:
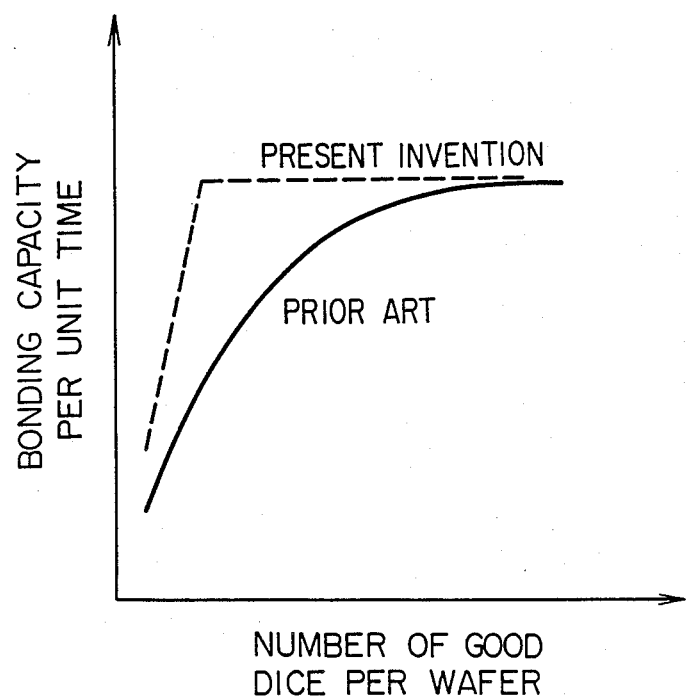
FIG. 10 is a graph showing the bonding capacity per unit time of the apparatus according to the present invention and that of the conventional apparatus.

In this embodiment, since the die bonding operation can be continued while the wafers are being replaced, as stated above, the bonding capacity per unit time can be improved, as shown by the broken line in FIG. 10. This is true even when the processed wafer is of the type in which the number of good dice per wafer is less.

The die retaining portion 82 of the stocker 8 shown in FIG. 5 is a recess formed on the surface of the stage 81. However, the recess may be replaced by a hole of a smaller size than the die 24 formed through the horizontal stage 81 in the vertical direction, and a vacuum may be supplied through the hole to retain the die 24 placed on the hole.

Figure 7:
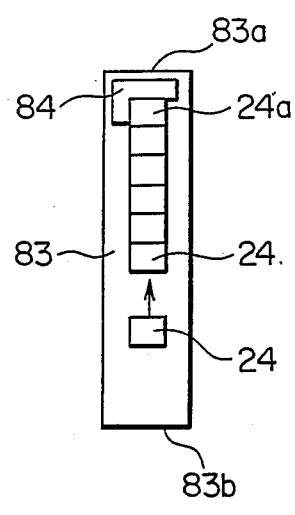
FIGS. 7 and 8 are plan views showing modified examples of the stocker 8, respectively.

The stocker 8 may be constructed such that it has a horizontal rectangular stage 83 with a stopper 84 provided at one end portion 83a thereof, as shown in FIG. 7. In this case, the first conveying device 9 picks up the die 24 from the wafer 21 and feeds it toward the stopper 84 along the stage 83 from the other end portion 83b thereof, aligning the die 24 on the stage 83 and making a die 24a disposed at the forward end of the line abut against the stopper 84. The second conveying device 10 picks up the die 24a which is in contact with the stopper 84, and conveys it to the die position correcting station 3 or the bonding station 6.

Figure 8:
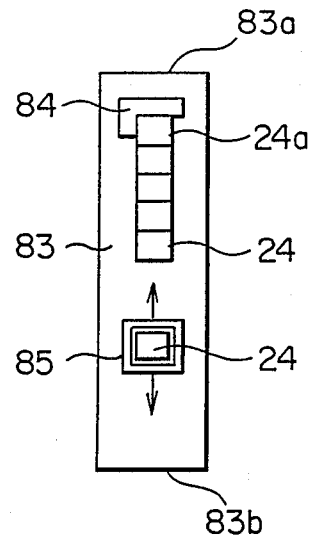

As shown in FIG. 8, the stocker 8 may further have a movable tray 85 on which the first conveying device 9 places a die 24. The tray 85 is normally located at the other end portion 83b of the stage 83 and is moved toward the stopper 84 along the stage 83 to align the dice 24 by a moving means (not shown) when a die 24 is placed thereon by the first conveying device 9. As in the former example, the die 24a located at the forward end of the line is in contact with the stopper 84, and the second conveying device 10 picks up that die 24a.

What is claimed is:

1. A die bonding apparatus comprising:
   a stocker for temporarily accommodating dice;
   a first conveying means for successively picking up a plurality of dice from one wafer and conveying them to said stocker;
   a wafer loader/unloader for replacing the wafer from which the dice have been picked up with a new one;
   a bonding station for bonding a die to a work which serves as a die mounting medium;
   a work loader for supplying works to said bonding station; and
   a second conveying means for successively conveying said dice accommodated in said stocker to said bonding station.

2. A die bonding apparatus according to claim 1, wherein said stocker has a disk-shaped rotatable stage with a plurality of die retaining portions formed around the periphery thereof, and a driving means for rotating said stage, said first conveying means supplying a die to the die retaining portion located at a first position by the rotation of said stage, and said second conveying means conveying a die retained in the die retaining portion located in a second position by the rotation of said stage to said bonding station.

3. A die bonding apparatus according to claim 2, wherein said die retaining portion comprises a recess formed on the surface of said stage.

4. A die bonding apparatus according to claim 2, wherein each of said die retaining portions includes a hole which is formed through said stage and has a smaller size than said die, said die bonding apparatus further comprising a vacuum suction means for supplying a vacuum to the hole to retain a die located opposite said hole.

5. A die bonding apparatus according to claim 1, wherein said stocker has a horizontal stage and a stopper provided at one end of said stage, said first conveying means successively feeding the dice toward said stopper along said stage from the other end of said stage so as to align said dice and make the die disposed at the forward end of the line abut against said stopper, and said second conveying means conveying the die which is in contact with said stopper to said bonding station.

6. A die bonding apparatus according to claim 1, wherein said stocker has a horizontal stage, a stopper provided on one end of said stage, a tray for receiving a die, and a moving means for moving said tray on said stage, said first conveying means placing a die on said tray located at the other end of said stage, said moving means moving said tray with said die placed thereon toward said stopper along said stage so as to align said dice and make the die disposed at the forward end of the line abut said stopper, and said second conveying means conveying a die which is in contact with said stopper to said bonding station.

7. A die bonding apparatus according to claim 1, wherein said first conveying means supplies to said stocker a sufficient number of dice for processing by said bonding station while said wafer loader/unloader is replacing the wafer.

8. A die bonding apparatus according to claim 7, wherein said second conveying means continuously conveys the dice from said stocker to said bonding station while said wafer loader/unloader is replacing the wafer.

9. A die bonding apparatus according to claim 1, wherein said first conveying means has a cycle time which is shorter than that of the bonding operation conducted in said bonding station.

* * * * *